United States Patent
Hawthorne et al.

[11] Patent Number: 5,898,575
[45] Date of Patent: Apr. 27, 1999

[54] SUPPORT ASSEMBLY FOR MOUNTING AN INTEGRATED CIRCUIT PACKAGE ON A SURFACE

[75] Inventors: Emily Hawthorne, San Francisco; John McCormick, Redwood City, both of Calif.

[73] Assignee: LSI Logic Corporation, Milpitas, Calif.

[21] Appl. No.: 08/710,573

[22] Filed: Sep. 19, 1996

Related U.S. Application Data

[63] Continuation of application No. 08/427,306, Apr. 24, 1995, abandoned, which is a continuation of application No. 08/170,102, Dec. 20, 1993, Pat. No. 5,410,451.

[51] Int. Cl.[6] .................................................. H05K 7/02
[52] U.S. Cl. .......................... 361/809; 361/714; 361/719; 361/720; 361/790; 361/804; 257/686; 257/707; 174/138 G; 206/726
[58] Field of Search ..................................... 361/807, 809, 361/707, 709–710, 714–715, 717, 718, 719, 720, 722–723, 804, 790, 808; 206/710–711, 726–728; 257/707, 686; 174/138 G

[56] References Cited

U.S. PATENT DOCUMENTS

| | | |
|---|---|---|
| 3,628,105 | 12/1971 | Sakai et al. . |
| 4,066,839 | 1/1978 | Cossutta et al. . |
| 4,215,360 | 7/1980 | Eytcheson . |
| 4,593,342 | 6/1986 | Lindsay . |
| 4,658,330 | 4/1987 | Berg . |
| 4,658,331 | 4/1987 | Berg . |
| 4,841,355 | 6/1989 | Parks ........................................ 257/686 |
| 4,849,856 | 7/1989 | Funari et al. ............................ 361/704 |
| 4,855,869 | 8/1989 | Tsuji ........................................ 174/52.3 |
| 4,953,060 | 8/1990 | Lauffer et al. ........................... 361/710 |
| 5,045,914 | 9/1991 | Casto et al. .............................. 257/686 |
| 5,072,283 | 12/1991 | Bolger . |
| 5,162,975 | 11/1992 | Matta et al. . |
| 5,257,162 | 10/1993 | Crafts ...................................... 361/704 |
| 5,410,451 | 4/1995 | Hawthorne et al. . |
| 5,471,097 | 11/1995 | Shibata . |
| 5,673,479 | 10/1997 | Hawthorne . |
| 5,734,555 | 3/1998 | McMahon ............................... 257/686 |

OTHER PUBLICATIONS

"Developments in Tape Automated Bonding," Electronic Packaging & Production, Nov. 1991, pp. 42–45.

*Primary Examiner*—Leo P. Picard
*Assistant Examiner*—John B. Vigushin

[57] ABSTRACT

A thin dielectric substrate bearing a plurality of conductive leads has a hole circumscribed by the substrate in which is positioned a die having pads that are bonded to ends of leads carried by the substrate and projecting into the hole for contact with the die pads. The leads include free outer ends that project laterally outwardly and downwardly away from the plane of the substrate for connection to contact pads on a circuit board. The free leads are isolated from pressure applied to the chip on tape assembly after it has been connected to a circuit board by means of a thin self-supporting thermally conductive heat spreader that contacts the side of the die opposite its pads and includes fixed standoff and/or alignment pins that extend through alignment holes in the thin substrate and are in physical contact with a surf ace of the printed circuit board. The arrangement enables transfer of force applied to the heat spreader directly to the circuit board, thereby isolating the die, thin substrate and its fragile free leads from forces applied to the die and/or the heat spreader.

29 Claims, 4 Drawing Sheets

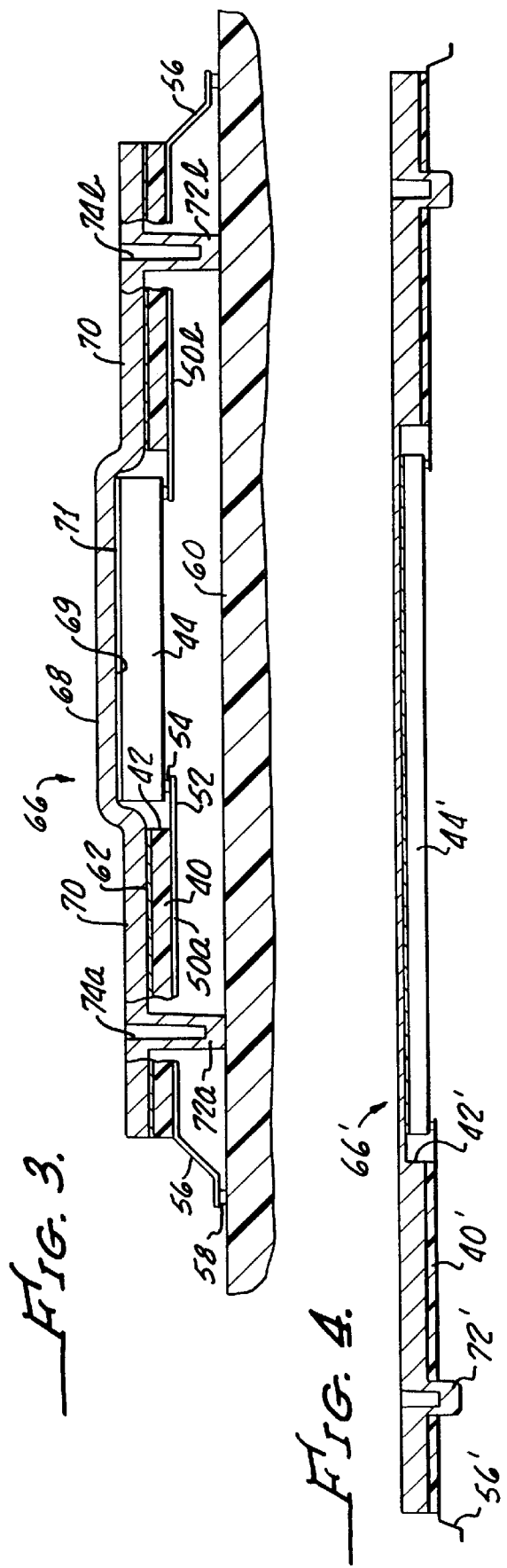

SUPPORT ASSEMBLY FOR MOUNTING AN INTEGRATED CIRCUIT PACKAGE ON A SURFACE

CROSS REFERENCE TO RELATED APPLICATIONS

This is a continuation of application Ser. No. 08/427,306, filed Apr. 24, 1995, now abandoned, which is a continuation of application Ser. No. 08/170,102, filed Dec. 20, 1993, which issued as U.S. Pat. No. 5,410,451 on Apr. 25, 1995.

BACKGROUND OF THE INVENTION

1. Field of the Invention

The present invention relates to a chip on tape package and more particularly concerns an arrangement for protecting the fragile leads of the package and for facilitating alignment during assembly of the die to the laminated tape.

2. Description of Related Art

A TAB (tape automated bonding) package, sometimes termed a chip on tape package, is one of several methods of assembling an integrated circuit die or chip to a plurality of conductive leads so as to allow the chip to be electrically connected to other components, such as conductive pads on a printed circuit board for example. The TAB package frequently comprises a section of a thin laminated tape formed of a thin layer of substrate and a layer of thin conductive leads bonded thereto with an opening, generally of rectangular configuration, to mate with the rectangular configuration of a die. The die is positioned substantially in the tape opening, and its connector pads are bonded to ends of the leads of the laminated tape that extend inwardly of the tape opening to overlay the respective conductive pads of the die to which they may be bonded by conventional automatic bonding techniques. The conductive leads of the tape extend laterally outwardly of all four outer sides of the tape section and also project downwardly below the tape section and die, being configured and arranged for resting upon and electrically contacting contact pads formed on another electrical component, such as a printed circuit board (PCB) for example. The laterally outwardly and depending free ends of the tape are bonded to the conductive pads of the printed circuit board for physical and electrical connection by conventional techniques, and hold the tape section and die spaced above the PCB.

In assembly of the tape to the die, the inner end of the tape leads must be precisely aligned with the die pads before bonding. This alignment has been carried out in the prior art either manually or visually, or by use of external alignment devices. Further, the assembly of die and tape, e.g. the TAB package, must be handled and shipped as a separate article, and is often assembled to other electrical components or a printed circuit board by automatic pick-and-place machines.

As more and more electronic functions are packaged within smaller and smaller packages, components, contact pads, and electrical leads all become increasingly smaller. Frequently the conductive leads of the TAB package have widths on the order of 0.002 inch and are spaced from one another by like distances. The thickness of the leads are even smaller than their 0.002 inch widths and spacing. These leads are generally made of copper, and extend freely and totally unsupported beyond the outer edges of the thin laminated tape. Consequently they are highly susceptible to bending, breaking and other types of damage. These fragile free leads are not only easily damaged by inadvertent contact with other objects, but sudden accelerations to which the TAB package may be subjected can also result in bending or distortion of the leads. Shipping of TAB packages is also difficult and inconvenient, often being carried out in complex carriers or on reels.

Die alignment is typically accomplished by external alignment devices, either visually or manually, which complicates production and assembly, and requires increased labor. Arrangements for protecting the TAB package leads for surface mounting have required separate and independent supporting devices. In some arrangements a hole is formed in the printed circuit board directly below the face of the die and a soft support, is inserted into the hole to support the die during attachment of a heat sink. In the prior art, if a heat sink is used, it is attached to the die after the TAB package has been mounted on the PCB. In the attachment of a heat sink to the opposite side of the die, some pressure must be exerted against the die and therefore against the PCB through the very fragile free leads, which are not capable of supporting any significant amount of pressure.

Prior solutions to these problems have addressed one or more, but not all of these problems. These solutions often require more area on the printed circuit board, require more parts and are difficult or virtually impossible to automate.

Accordingly, it is an object of the present invention to provide for mounting, alignment and protection of leads of a TAB package by methods and structures that avoid or eliminate above mentioned problems.

SUMMARY OF THE INVENTION

In carrying out principles of the present invention in accordance with a preferred embodiment thereof, a TAB package incorporating a die and a substrate having conductive leads is provided with a relatively strong support member secured to one side of the die and extending to side portions of the substrate. This support member becomes a permanent part of the TAB package. A plurality of rigid support, alignment or standoff pins are fixedly carried by the support member laterally outwardly of the die and project through the substrate, in a direction perpendicular to the substrate, by a distance not less than the distance by which the free outer ends of the substrate conductive leads project from the plane of the substrate.

Embodiments of the present invention incorporate standoff pins that facilitate assembly of the TAB package by acting as alignment pins for alignment to a heat spreader which forms the support member fixed to the die of the TAB package. The standoff pins are a part of the heat spreader/support member and provide a rigid and strong package to PCB spacing for the TAB package, a rigid support and protection of fragile outer leads for heat sink mounting on top of a TAB package by resisting pressure. A heat spreader standoff pin may also be connected to the board to provide resistance to relative lateral motion of the package and board, and they facilitate mounting of a heat sink TAB package having leads with free ends into a shipping package to prevent damage during shipping for both those arrangements in which the free leads are connected to a keeper bar and those without a keeper bar.

Another aspect of the present invention concerns a method of packaging an integrated circuit die, including the steps of forming a support member having a central die receiving portion, a plurality of laterally outward side portions and a plurality of projecting pins, forming a substrate having a dielectric layer and a plurality of conductive leads with inner portions and outer ends, forming pin holes in the substrate, bonding the inner end portions of the leads to conductive pads on an integrated circuit die to form a sub-assembly of die, substrate and leads, placing the sub-assembly upon the support member with the projecting pins extending through and beyond the pin holes, and bonding the die and substrate to the support member to form a die package.

While the present invention has been depicted, described, and is defined by reference to particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

BRIEF DESCRIPTION OF THE DRAWINGS

In the accompanying drawings,

FIG. 3 is a sectional side elevation of the package of FIG. 2;

FIG. 4 illustrates a TAB and support member package without the printed circuit board but showing the various parts of the package in a properly scaled relation;

DETAILED DESCRIPTION OF THE PREFERRED EMBODIMENTS

Figure 1:
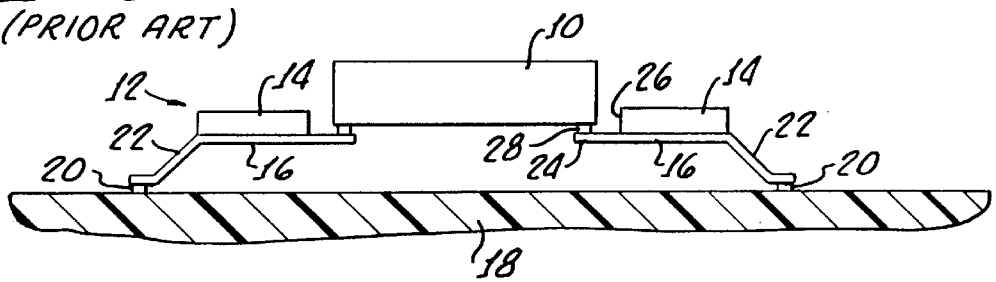
FIG. 1 is a sectional view of a die and substrate package of the prior art.

Illustrated in FIG. 1 is an exemplary showing of a typical TAB package of the prior art involving an integrated circuit die 10, a thin laminated tape 12 incorporating a dielectric, such as a polyimide substrate 14, having a plurality of thin electrically conductive leads 16 formed thereon. The package of die and tape is shown mounted to a printed circuit board 18 having surface pads 20 that are bonded to the laterally outwardly and downwardly free ends 22 of leads 16. The latter have inner ends 24 projecting inwardly of an inner hole 26 formed in the dielectric substrate 14, in which hole the die 10 is positioned. Inner ends 24 of the tape leads are bonded for electrical connection to pads 28 of the die. As previously mentioned, the leads 16 are often of very fine pitch, being spaced by as little as 1–2 mils, having widths of about 2 mils, and thicknesses of as little of 1 mil. It will be seen that handling of the package of die and tape before, and even after, connection to the printed circuit board is fraught with the danger of damage to the exceedingly fragile leads, particularly at their free ends 22. Transport of the package of die and tape prior to attachment to the printed circuit board 18 will subject the free unsupported ends 22 of the leads to physical contact or inertial forces that may result in major damage. Attachment of any type of device, such as, f or example, a heat sink, to the upper side of the die will almost always involve some type of force that tends to press the die downwardly toward the circuit board, thereby putting further unacceptable stress on the lead ends 22.

Figure 2:
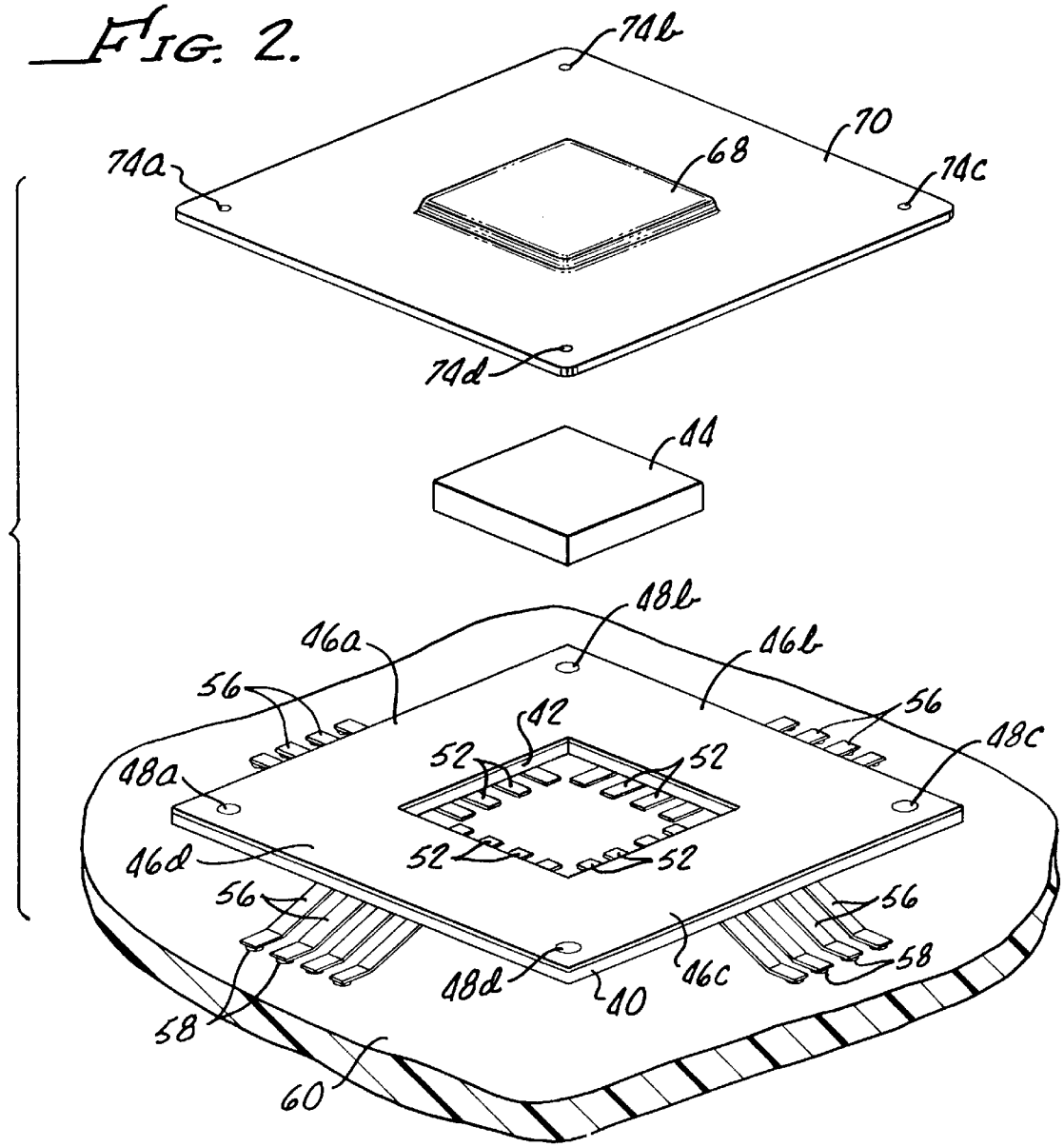
FIG. 2 is an exploded pictorial view of a TAB and support member package embodying principles of the present invention.

Illustrated in FIGS. 2, 3 and 4 is one example of a TAB package that either entirely avoids or at least substantially minimizes problems of the prior art package. This new package incorporates a tape with laminated dielectric and conductive leads, and a heat spreader or rigid support member having standoff and/or alignment pins. The tape includes a thin dielectric layer of a polyimide or like material 40, having an inner aperture 42 with a configuration generally conforming to but larger than the outer dimensions of a die 44 that is located within the hole 42. The dielectric substrate has outer side portions 46a,b,c, and d that circumscribe the hole and include alignment holes 48a,b,c and d for purposes to be described below. A pattern of thin electrically conductive leads, such as leads 50a,50b (FIG. 3), are laminated to the dielectric and have inner ends, such as end 52 (FIG. 3) projecting inwardly into the hole 42 or bonding to pads 54 (FIG. 3) on the die 44. The leads include outer ends 56 which extend laterally outwardly of the outer edges of the dielectric substrate sides 46a through 46d and project from the plane of the substrate. Ends of the lead ends 56 are electrically bonded to pads 58 (FIG. 3) on a printed circuit board 60 to which the TAB package is mounted.

A layer of adhesive 62 on the side of the substrate opposite the side on which the leads are formed secures a heat spreader, generally indicated at 66. The heat spreader is formed of a rigid, strong, self-supporting, thermally conductive material such as a suitable metal or a polyphenylene sulfide (PFS) known under the trademark Deltem. A thermally conductive adhesive 71 (FIG. 3) secures the die directly to the inner surface of the central areas of the heat spreader. Because it is thermally conductive and secured to the die by a thermally conductive adhesive, the heat spreader acts to distribute heat laterally outwardly from the die.

The heat spreader is either molded or stamped in the configuration shown, having a somewhat raised central die receiving section 68 surrounded by lateral sections 70, each of which is formed with an integral standoff pin, such as standoff pins 72a,72b. Each standoff pin, in the stamped version, has a hollow recess on the rear side thereof, generally indicated at 74a and 74b in FIG. 2. If the heat spreader is molded it may or may not be formed with the depression 74a in the rear portions of standoff and alignment pins 72a, depending upon the use to which the pins are to be put.

The standoff pins 72a,72b, etc. are received in holes 48a through 48d of the substrate, extending completely therethrough to project a short distance beyond the lower side of the substrate. Preferably the pins project a distance from the plane of the substrate that is at least equal to the distance that the lower and outermost ends of lead ends 56 extend from such surface. This arrangement ensures that any pressure exerted downwardly (in the orientation of FIGS. 2 and 3) against the upper side of the heat spreader will be transferred directly to the printed circuit board by means of the pins, completely bypassing transmission of any such forces to the die, substrate or, most importantly, lead ends 56. The pins are rigid and extend perpendicular to the plane of substrate 40, and thus provide a fixed spacing of the die from the PCB.

In assembly of the package of FIGS. 2 and 3, heat spreader 66 is placed in an upwardly facing fixture with a side 69 of the central or die receiving section 68 facing upwardly and with the spreader pins 72a,72b, etc. facing upwardly. Die attaching materials, such as the suitable thermally conductive adhesive 71, is dispensed onto the surface 69. The TAB package has been previously assembled to include the die, the tape having its substrate 40 and conductive leads. These leads have been previously bonded to the die pads 54 at the inner ends of the leads. This sub-assembly is then properly aligned to the heat spreader, utilizing the pins 72a,72b, etc. for alignment. The pins are aligned with the holes 48a through 48d in the substrate and inserted into and completely through the holes as the TAB package of die and laminated substrate and conductive leads is moved downwardly to the upwardly facing surface of the heat spreader. The adhesive 62 has been dispensed upon outer portions of the heat spreader beyond the die, and the TAB package is laminated to the heat spreader by clamping and applying heat or pressure or both. The active face of the die (the lower face as viewed in FIG. 3) remains facing outwardly from the assembly. Consequently, a complete assembly of die, tape, leads and rigid support member has been formed and this assembly is sturdy, more rigid, less susceptible to damage, more readily handled for transport and attachment to a PCB because the rigid self-supporting heat spreader is an integral part of the assembly.

Alignment of the heat spreader to the TAB package is accomplished more precisely, more quickly and more easily. Further, after the assembly of heat spreader and TAB package have been mounted to the printed circuit board by placing the assembly at the proper location on the circuit board and bonding the lead ends 56 to the PCB tabs, a suitable heat sink can be added to the upper surface of the heat spreader, employing downward pressure without damaging the outer leads. Generally such a heat sink is a thin, heat conductive element of greater mass and larger size that is bonded to the upper surface of the die, or in this case the upper surface of the heat spreader, by pressing downwardly against the die. Without the heat spreader pins the mounting of such a heat sink to the die or to the heat spreader on the die would require pressing downwardly to stress the outer lead ends 56. With the arrangement illustrated in FIGS. 2 and 3 such pressure required to mount the heat sink is taken directly by compressive forces exerted on the heat spreader standoff pins 72a through 72d, which press directly against the PCB and relieve the fragile lead ends 56 from experiencing any stress. Moreover, because the rigid pins do not yield under pressure, the force applied need not be precisely controlled and, therefore, the heat sink may be more easily applied.

Preferably the standoff and alignment pins are incorporated into the heat spreader during stamping or molding or other manufacture of the heat spreader. Preferably they are integral with the unit but could be swaged in or pressed in for some applications.

Various details of construction of the TAB package and the bonding of the flexible laminated tape to the die pads are described in a co-pending application of John McCormick and John Lynch (Docket 92-129, LLC-2108) for Multilayer TAB Tape Having Distinct Signal Power and Ground Planes, Semiconductor Device Assembly Employing Same, Apparatus and Method of Assembling Same, Ser. No. 07/894,031, Filed Jun. 4, 1992, and assigned to the assignee of the present application. The disclosure of this co-pending application is incorporated herein by this reference as though-fully set forth.

FIG. 4 illustrates the heat spreader and TAB package of FIGS. 2 and 3 prior to attachment to a printed circuit board to a more precise scale to better indicate relative sizes of the parts. Elements shown in FIG. 4 analogous to the similar elements of FIGS. 2 and 3 are designated by the same reference numeral with an apostrophe (') added to the numerals.

Figure 5:
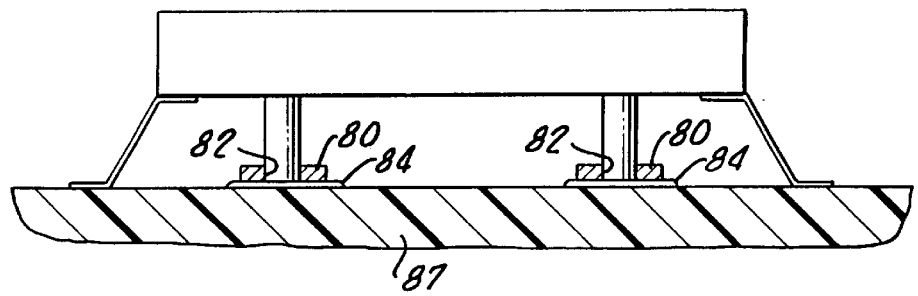
FIGS. 5 and 5a describe an embodiment of the invention which provides for lateral support of the package.
Figure 6:
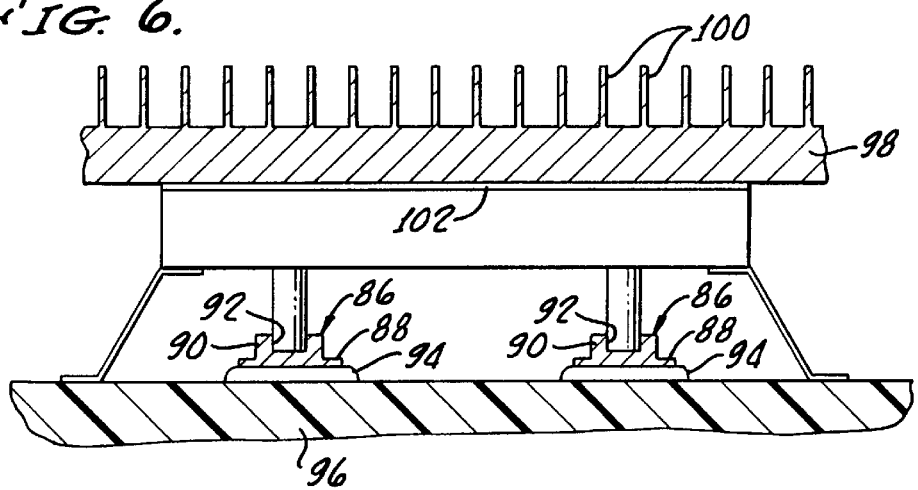
FIGS. 6 and 6a show a modification of the embodiment of FIG. 5 with a heat sink mounted thereon.
Figure 7:
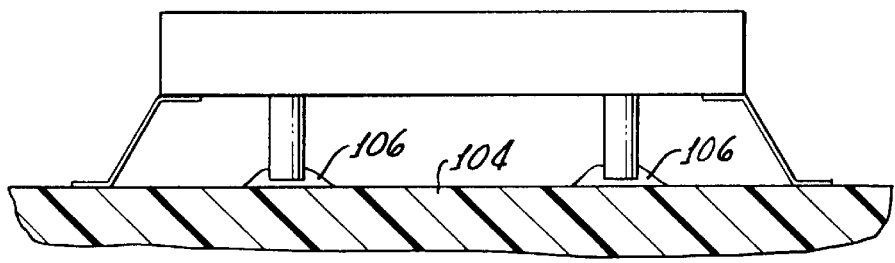
FIG. 7 illustrates still a further modification.

The arrangement illustrated in FIGS. 2, 3 and 4 allow the alignment and standoff pins to provide good support for the package against pressure exerted in directions generally normal to the surface of the printed circuit board. FIGS. 5, 6 and 7 illustrate several different ways to add resistance to relative lateral motion of the TAB and heat spreader package. These embodiments provide resistance to forces tending to shift the package laterally along the surface of the printed circuit board.

It should be noted that the several drawings (all except FIG. 4) are not to scale, showing parts with different relative proportions and dimensions in order to more clearly illustrate significant features. Only FIG. 4 is drawn to correct scale. In particular, pin lengths are exaggerated in all but FIG. 4.

Figure 5A:
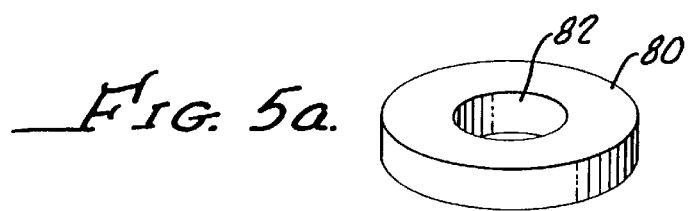

As illustrated in FIGS. 5 and 5a, an apertured washer 80, having through hole 82 therein, may be fixed to either the ends of the heat spreader pins that extend through the holes in the substrate or are fixed to the printed circuit board 87 at appropriate positions. The washers 80 are fixed to the pins and/or the printed circuit board by means of an adhesive 84 or solder or the like. The washers may be made of a resilient material to provide greater resistance to sudden forces and to facilitate mounting.

FIG. 5 shows a vertical section of the heat spreader TAB package assembled with the washers 80 to resist lateral motion relative to the printed circuit board. The washer is shown in perspective form in FIG. 5a.

FIG. 6 shows an alternate configuration of a shoe 86, instead of a washer, to be positioned on each of the ends of the heat spreader pins protruding through the TAB package substrate. Shoe 86 includes a relatively broad base portion 88, having an upstanding boss 90 therein in which is formed a blind aperture 92 that receives the free ends of the heat spreader pins. As in the arrangement of FIGS. 5 and 5a, the shoe 86 is fixed to the printed circuit board at an appropriate position by means of an adhesive or solder 94, and also may be made of a resilient material.

Figure 6A:
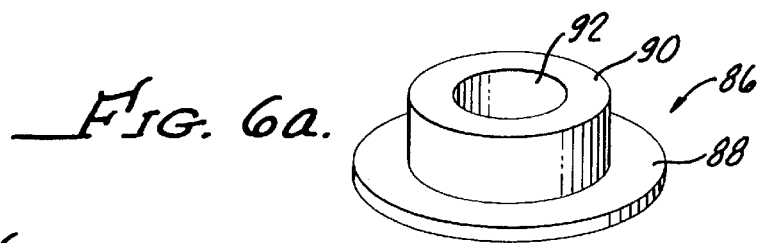

FIG. 6 is a sectional side view showing the shoe 86 that is shown in perspective in FIG. 6a. Shoes 86 are positioned on the ends of the spreader pins so as to resist lateral motion of the TAB package and heat spreader relative to the printed circuit board 96 of FIG. 6. The shoes contact the sides of the pins to resist lateral motion. FIG. 6 also shows a heat sink 98 having fins 100 fixed to the upper surface of the heat spreader TAB package by means of a suitable bonding agent such as an epoxy 102. As noted above, to apply the heat sink 98 to the heat spreader TAB package, the heat spreader TAB package is first mounted to the printed circuit board with its shoes, washers or the like, as may be preferred, so that the package is securely mounted with the fragile lead ends of the package protected against forces exerted normally and laterally of the printed circuit board. Epoxy 102 is then applied to a portion of the upper surface of the heat spreader package, and the heat sink then is placed on the epoxy and pressed downwardly to ensure proper contact and curing of the epoxy so as to properly bond the heat sink to the heat spreader. The pressure of the heat sink against the heat spreader and TAB package is transferred directly to the printed circuit board by means of the spreader pins and shoes and no pressure is exerted against the fragile free ends of the package. This pressure does not move the die closer to the pads, so that even an excess of pressure will not bend or distort the leads nor cause the die to contact the PCB.

FIG. 7 illustrates an arrangement in which the free ends of the heat spreader pins are directly secured to the printed circuit board 104 by means of a fillet 106 of solder or adhesive that comes up along part of the sides of the pins.

In the arrangements of FIGS. 5, 6 and 7 it is presently contemplated that the washers or shoes will be applied to the free ends of the spreader pins and then coated with an adhesive or plated with a solder so that they can then be bonded to the printed circuit board during (at the same time as) the surface mounting of the heat spreader TAB package upon the printed circuit board. Thus, no separate steps are needed to secure the heat spreader to the PCB.

Figure 8:
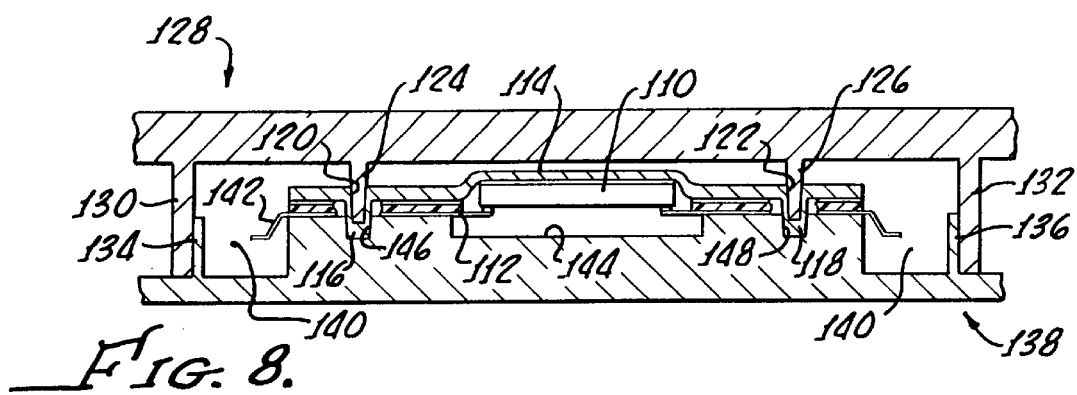
FIG. 8 illustrates part of a shipping tray configured for mounting and handling a TAB package embodying principles of the present invention.
Figure 9:
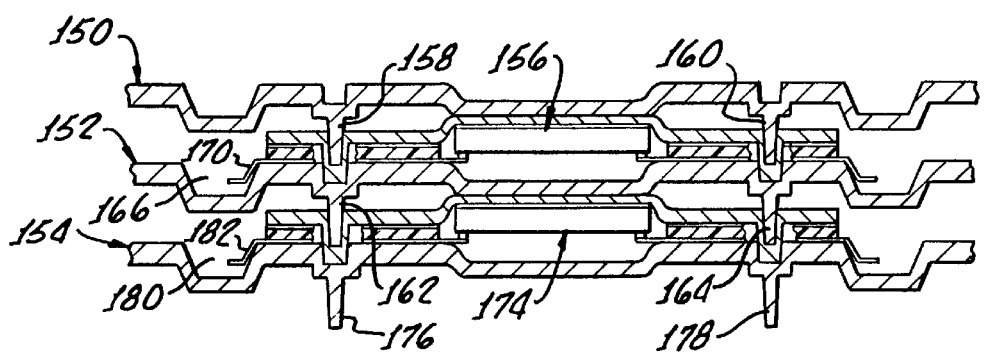
FIG. 9 illustrates the stacking of shipping tray sections of the type shown in FIG. 8.

The spreader pins not only assist in secure mounting of the package upon a printed circuit board but greatly facilitate packaging, handling and transport of the TAB package by means of a shipping tray in the manner illustrated in FIG. 8. FIG. 8 shows a TAB package, including a die 110 and substrate and conductive lead lamination 112, mounted to a head spreader 114 having heat spreader pins 116,118. The heat spreader pins include recesses 120,122 formed in rear portions thereof and in alignment with the pins, whether the heat spreader is stamped or molded. Heat spreader pin recesses 120,122 receive downwardly projecting legs 124, 126 of an upper shipping tray section 128, having depending wall portions 130,132 that are positioned outwardly of the perimeter of the heat spreader TAB package and cooperate with upwardly projecting wall portions 134,136 formed on a lower shipping tray section 138. Lower shipping tray 138 has a plurality of recesses, such as recess 140, to freely receive, without any contact, the free ends 142 of the leads of the heat spreader TAB package. The lower shipping tray section also includes a centrally depressed portion 144 that provides adequate clearance, without any contact, for the die and the inner lead ends connected thereto. A plurality of upwardly facing pin receiving recesses 146,148 are formed in lower tray section 138, in alignment with heat spreader pins 124,126 to receive and stabilize the TAB, heat spreader package during shipping. The upper and lower shipping trays 128,138, are rigidly and detachably fixed to one another by any suitable means (not shown) so that they may be fixedly positioned during handling but readily detached to insert and remove the heat spreader TAB package.

The shipping tray arrangement of FIG. 8 may be modified to provide a nested and stacked arrangement of shipping tray sections, including an uppermost tray section 150, an intermediate tray section 152 and a lower tray section 154. It will be understood that, although three such tray sections are shown, a larger number may be stacked in the manner illustrated. Between the upper and intermediate shipping tray sections 150 and 152 is mounted a first heat spreader TAB package 156 of the type described above. Upper tray section 150 is formed with legs 158, 160 received in and pressing against the recesses in the upper sides of the standoff pins of heat spreader TAB package 156. The pins of the latter are aligned with and extend into recesses formed in the upper sides of legs 162,164 of the intermediate shipping tray section 162, with the two trays being configured to provide a space 166 therebetween to receive the free leads 170 of the heat spreader TAB package 156.

In a like manner, a second heat spreader TAB package 174 is mounted between the intermediate and lower shipping tray sections 152,154, with legs 162,164 of the intermediate shipping tray section projecting into depressions in the upper portions of the standoff pins of the heat spreader TAB package 174. The heat spreader pins of the latter package extend into recesses aligned with and positioned at the rear portion of legs 176,178 of the lower shipping tray section 154, with the latter cooperating with the intermediate tray 152 to provide a space 180 to receive the free lead ends 182 of the heat spreader TAB package 174. The several shipping tray sections are detachably secured together by any suitable means and are configured to mount a plurality of the heat spreader TAB packages all in a common plane between any one pair of the shipping tray sections. So, too, the shipping tray sections of FIG. 8 may be configured to mount a plurality of side-by-side heat spreader packages.

Figure 10:
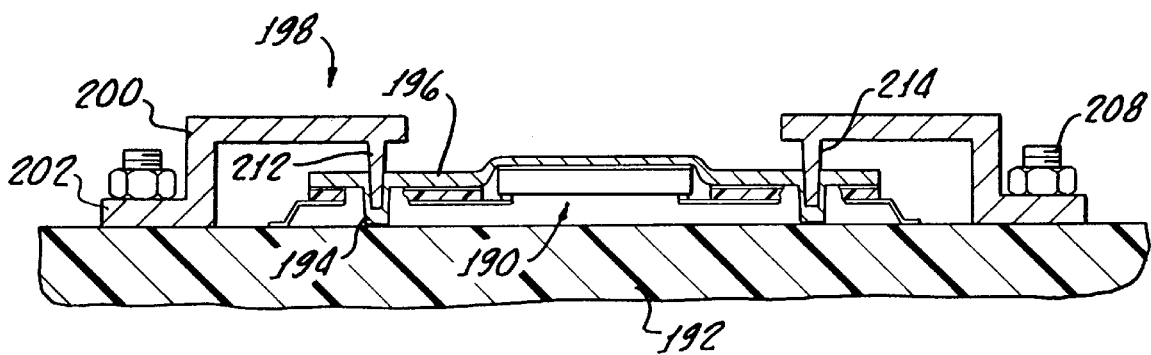
FIG. 10 illustrates the mounting of a housing to protect the TAB package embodying principles of the present invention.

FIG. 10 illustrates one manner of securing and protecting a heat spreader TAB package to a printed circuit board or other device, whether for operation or handling, by use of a protective housing. Thus, as illustrated in FIG. 10, a printed circuit board heat spreader package 190 is mounted to a printed circuit board 192, with the spreader pins 194 providing a rigid perpendicular standoff between the heat spreader 196 and the circuit board. A housing 198 having depending side portions 200 and laterally outwardly projecting perimetral flanges 202 is suitably secured to the printed circuit board as by bolts, screws, adhesive or the like 208. The housing is formed with fixed depending legs 212,214 aligned with and received in recesses formed in the backs of heat spreader pins 194 to securely connect the TAB heat spreader package to the PCB and to the protective housing. The housing covers only the outer leads of the TAB heat spreader package, or may, if desired, enclose the entire package. Thus the outer leads of the package are fully and completely protected by the housing 198.

There have been described various configurations and methods of manufacture of standoffs and alignment pins to facilitate assembly of a heat spreader chip on tape package providing a rigid, strong package for handling, shipping and mounting on a printed circuit board. The arrangement provides protection for the fragile outer leads of the TAB package, protects against both normal and lateral stresses, enables shipping of chip on tape packages with free leads, providing isolation and protection for the exposed outer leads during shipment.

We claim:

1. A support assembly for mounting an integrated circuit package on a surface, the package including an integrated circuit die and a substrate having a plurality of leads extending outwardly therefrom, said support assembly comprising:

a base for supporting the package;

a plurality of rigid spacers extending from said base for abutment against the surface to provide a predetermined spacing between the substrate and the surface; and an aperture washer at a base of each of said spacers for securing to a top of the surface.

2. The support assembly of claim 1 wherein each said washer is made of a resilient material to provide greater resistance to sudden forces and to facilitate mounting.

3. The support assembly of claim 1 wherein each said washer is securable by adhesive to the surface top.

4. The support assembly of claim 1 wherein each said washer is coated with an adhesive for bonding to the top of the surface at the same time as the package is surface mounted to the surface.

5. The support assembly of claim 1 wherein each said washer is plated with a solder for bonding to the top of the surface at the same time as the package is surface mounted thereto.

6. A support assembly for mounting an integrated circuit package on a surface, the package including an integrated circuit die and a substrate having a plurality of leads extending outwardly therefrom, said support assembly comprising:

a base for supporting the package;

a plurality of rigid spacers extending from said base for abutment against the surface to provide a predetermined spacing between the substrate and the surface; the a shoe at an end of each of said spacers for engaging the surface.

7. The support assembly of claim 6 wherein each said shoe includes a base portion and a boss upstanding from said base portion, said boss having a blind aperture which receives therein a free end of a respective said spacer.

8. The support assembly of claim 6 wherein each said shoe is made of a resilient material.

9. The support assembly of claim 6 wherein each said shoe is affixed to a top of the surface with an adhesive.

10. The support assembly of claim 6 wherein each said shoe is affixed to a top of the surface with solder.

11. The support assembly of claim 6 wherein each said shoe contacts sides of a respective said spacer to resist lateral motion of said base relative to the surface.

12. The support assembly of claim 6 further comprising a heat sink mounted with epoxy to a top of said base.

13. The support assembly of claim 6 wherein each said shoe is coated with adhesive for bonding to the top of the surface at the same time as the package is surface mounted thereto.

14. The support assembly of claim 6 wherein each said shoe is plated with solder for bonding to the top of the surface at the same time as the package is surface mounted thereto.

15. A support assembly for mounting an integrated circuit package, on a surface, the package including an integrated circuit die and a substrate having a plurality of leads extending outwardly therefrom, said support assembly comprising:

a base for supporting the package;

a plurality of rigid spacers extending from said base for abutment against the surface to provide a predetermined spacing between the substrate and the surface, said spacers and said base forming a heat spreader member; and a housing engageable with said heat spreader for protecting outer ends of the leads.

16. The support assembly of claim 15 wherein said housing is securable to the surface at a location spaced outwardly from the package.

17. The support assembly of claim 15 wherein said housing engages into recesses in said spacers.

18. A support assembly for mounting an integrated circuit package on a surface, the package including an integrated circuit die and a substrate having a plurality of leads extending outwardly therefrom, said support assembly comprising:

a base for supporting the package;

a plurality of rigid standoff pins extending from said base for abutment against the surface to provide a predetermined spacing between the substrate and the surface, said pins each having a hollow recess at a rear end thereof; and a housing for protecting outer ends of the leads and including one portion engageable in at least one of said hollow recesses and another portion securable to the surface.

19. The support assembly of claim 18 further comprising a securement member for securing the package to the surface, said securement member engaging in at least one of said hollow recesses.

20. A support assembly for mounting an integrated circuit package on a surface, the package including an integrated circuit die and a substrate having a plurality of leads extending outwardly therefrom, said support assembly comprising:

a base for supporting the package; and a plurality of rigid standoff pins extending from said base for abutment against the surface to provide a predetermined spacing between the substrate and the surface, said pins each having a hollow recess at a rear end thereof, wherein said hollow recesses are adapted to receive therein front ends of standoff pins of another said support assembly for stack storage thereof.

21. A support assembly for mounting an integrated circuit package on a surface, the package including an integrated circuit die and a substrate having a plurality of leads extending outwardly therefrom, said support assembly comprising:

a base for supporting the package;

a plurality of rigid standoff pins extending from said base for abutment against the surface to provide a predetermined spacing between the substrate and the surface, said pins each having a hollow recess at a rear end thereof; and a securement member for securing the package to the surface, said securement member engaging in at least one of said hollow recesses.

22. The support assembly of claim 21 wherein said securement member is formed with a leg aligned with and received in at least one of said hollow recesses.

23. The support assembly of claim 21 wherein said securement member comprises a housing having side portions and laterally outwardly projecting perimetral flanges, wherein said flanges are secured to the surface.

24. The support assembly of claim 23 wherein said housing covers outer ends of said leads.

25. A support assembly for mounting an integrated circuit package on a surface, the package including an integrated circuit die and a substrate having a plurality of leads extending outwardly therefrom, said support assembly comprising:

a base for supporting the package;

a plurality of rigid standoff pins extending from said base for abutment against the surface to provide a predetermined spacing between the substrate and the surface, said pins each having a hollow recess at a rear end thereof; and a tray engaging in at least one of said hollow recesses.

26. The support assembly of claim 25 wherein said tray includes legs which engage into said hollow recesses.

27. The support assembly of claim 25 further comprising a second tray formed with recesses to receive said pins.

28. The support assembly of claim 27 wherein said tray comprises downwardly projecting wall portions positioned outwardly of the perimeter said leads, and said second tray comprises upwardly projecting wall portions which cooperate with said downwardly projecting wall portions.

29. A support assembly for mounting an integrated circuit package on a surface, the package including an integrated circuit die and a substrate having a plurality of leads extending outwardly therefrom, said support assembly comprising:
- a base for supporting the package;
- a plurality of rigid standoff pins extending from said for abutment against the surface to provide a predetermined spacing between the substrate and the surface, said pins each having a hollow recess at a rear end thereof; and
- a tray engaging in at least one of said pins.

* * * * *